United States Patent
Marco Rius et al.

(10) Patent No.: US 12,429,536 B2
(45) Date of Patent: Sep. 30, 2025

(54) SYSTEM AND METHOD FOR NMR ANALYSIS OF A PHYSIOLOGICAL CONDITION IN AN ANALYTE

(71) Applicants: FUNDACIÓ INSTITUT DE BIOENGINYERIA DE CATALUNYA, Barcelona (ES); INSTITUCIÓ CATALANA DE RECERCA I ESTUDIS AVANÇATS, Barcelona (ES)

(72) Inventors: Irene Marco Rius, Terrassa (ES); Jose Yeste Lozano, Les Franqueses del Vallès (ES); Alba Herrero Gómez, Barcelona (ES); Marc Azagra Rodríguez, Esplugues de Llobregat (ES); Maria Alejandra Ortega Machuca, Barcelona (ES); Javier Ramón Azcón, Badalona (ES)

(73) Assignees: FUNDACIÓ INSTITUT DE BIOENGINYERIA DE CATALUNYA, Barcelona (ES); INSTITUCIÓ CATALANA DE RECERCA I ESTUDIS AVANCATS, Barcelona (ES)

(*) Notice: Subject to any disclaimer, the term of this patent is extended or adjusted under 35 U.S.C. 154(b) by 159 days.

(21) Appl. No.: 18/557,556

(22) PCT Filed: Apr. 25, 2022

(86) PCT No.: PCT/EP2022/060911
§ 371 (c)(1),
(2) Date: Oct. 26, 2023

(87) PCT Pub. No.: WO2022/229107
PCT Pub. Date: Nov. 3, 2022

(65) Prior Publication Data
US 2024/0210337 A1 Jun. 27, 2024

(30) Foreign Application Priority Data

Apr. 26, 2021 (EP) .................................... 21382358

(51) Int. Cl.
*G01R 33/30* (2006.01)
*G01N 24/08* (2006.01)
(Continued)

(52) U.S. Cl.
CPC .......... *G01R 33/302* (2013.01); *G01N 24/08* (2013.01); *G01R 33/282* (2013.01); *G01R 33/4625* (2013.01); *G01R 33/465* (2013.01)

(58) Field of Classification Search
CPC .... G01N 24/08; G01R 33/282; G01R 33/302; G01R 33/4625; G01R 33/465
See application file for complete search history.

(56) References Cited

U.S. PATENT DOCUMENTS

2007/0148054 A1* 6/2007 Takahashi ........... B01F 25/4331
422/130
2008/0003138 A1* 1/2008 Sakurai ............. B01L 3/502707
422/68.1

(Continued)

FOREIGN PATENT DOCUMENTS

ES          2365282        9/2011
WO    WO-2011113980 A1 *  9/2011 ............. C12M 1/34
WO        2017156124       9/2017

OTHER PUBLICATIONS

WO 2011/113980 and Machine translation (Year: 2011).*
(Continued)

*Primary Examiner* — Steven L Yeninas
(74) *Attorney, Agent, or Firm* — Peter B Scull

(57) ABSTRACT

The disclosure relates to a system and a method of analysing a physiological condition in an analyte. In particular, the disclosure pertains to systems, components of such systems, (Continued)

and methods of analysing a physiological condition in an analyte using hyperpolarization (HP) and magnetic resonance (MR) techniques.

16 Claims, 13 Drawing Sheets

(51) Int. Cl.
    *G01R 33/28*      (2006.01)
    *G01R 33/46*      (2006.01)
    *G01R 33/465*      (2006.01)

(56) References Cited

U.S. PATENT DOCUMENTS

| | | | |
|---|---|---|---|
| 2010/0160173 | A1 | 6/2010 | McHale et al. |
| 2011/0095759 | A1* | 4/2011 | Bhattacharya ......... G01R 33/30 324/307 |
| 2017/0153218 | A1* | 6/2017 | Chekmenev ......... G01R 33/282 |
| 2019/0204397 | A1* | 7/2019 | Alsop ..................... A61K 49/10 |
| 2020/0292640 | A1* | 9/2020 | Rahimi-Keshari .... G01N 24/08 |
| 2020/0386833 | A1* | 12/2020 | Breynaert .......... G01R 33/5605 |

OTHER PUBLICATIONS

PCT/EP2022/060911 International Search Report, Search Strategy and Written Opinion (total 14 pages); European Patent Office, Rijswijk NL, Jul. 22, 2022.
Bordonali Lorenzo et al, "Parahydrogen based NMR hyperpolarisation goes micro: an alveolus for small molecule chemosensing", England; DOI: 10.1039/C8LC01259H external link Jan. 29, 2019 (Jan. 29, 2019), p. 503-512, Retrieved from the Internet: URL:https://pubs.rsc.org/en/content/articlepdf/2019/lc/c8lc01259h; XP055843827; DOI: 10.1039/C8LC01259H external link [retrieved on Sep. 22, 2021]; 1-3,8,9, 12,13 p. 504, right-hand column paragraph 4; figure 1.
Raluca M Fratila and Aldrik H Velders, "Small-volume nuclear magnetic resonance spectroscopy", Mar. 8, 2011 (Mar. 8, 2011), vol. {0} 4, p. 227-249; XP002679516; DOI:10.1146/ANNUREV-ANCHEM-061010-114024 external link ISSN:1936-1327 [retrieved on Mar. 8, 2011]; 1-5, 13; chapter 4.2.
Akalin Gulen Oytun et al, "Preparation and Characterization of Nanoporous Sodium Carboxymethyl Cellulose Hydrogel Beads", US vol. {0} 2018, DOI: 10.1155/2018/9676949 external link; ISSN:1687-4110 ; Apr. 15, 2018 (Apr. 15, 2018), p. 1-12, Journal of Nanomaterials; Retrieved from the Internet: URL:http://downloads.hindawi.com/journals/jnm/2018/9676949.XML; XP055855427; DOI: 10.1155/2018/9676949 external link ISSN:1687-4110 [retrieved on Oct. 27, 2021]; 8,14; p. 9, right-hand column; figure 7.
Toledo Paulo V et al, "Carboxymethyl cellulose/poly(acrylic acid) interpenetrating polymer network hydrogels as multifunctional adsorbents", Jan. 21, 2019 (Jan. 21, 2019), vol. {0} 26, No. {0} 1, p. 597-615, XP036704031; DOI: 10.1007/S10570-018-02232-9 external link; ISSN:0969-0239 [retrieved on Jan. 21, 2019]; 1,8,14-16; the whole document.
Brougham D. F. et al, "Artificial Neural Networks for Classification in Metabolomic Studies of Whole Cells Using 1 H Nuclear Magnetic Resonance", vol. {0} 2011, DOI: 10.1155/2011/158094 external link ISSN: 1110-7243 Sep. 15, 2010 (Sep. 15, 2010), p. 1-8, Journal of Biomedicine and Biotechnology Retrieved from the Internet: URL:http://downloads.hindawi.com/journals/bmri/2011/158094.pdf ; XP055844158; DOI:10.1155/2011/158094 external link ISSN:1110-7243 [retrieved on Sep. 22, 2021]; 1,6,7,10,11; chapter 2.
Kiss Sebastian Z. et al, "Microfluidic Overhauser DNP chip for signal-enhanced compact NMR", vol. {0} 11, No. {0} 1, DOI: 10.1038/s41598-021-83625-y external link Feb. 25, 2021 (Feb. 25, 2021), p. 1-11, Scientific Reports; Retrieved from the Internet: URL:http://www.nature.com/articles/s41598-021-83625-y ; XP055843809; DOI: 10.1038/s41598-021-83625-y external link [retrieved on Sep. 22, 2021]; 1,8; p. 1-p. 3.
Liu Yang et al, "Superabsorbent Sponge and Membrane Prepared by Polyelectrolyte Complexation of Carboxymethyl Cellulose/Hydroxyethyl Cellulose-Al 3+", Internet 2015, p. 6479-6495, Retrieved from the Internet: URL:https://bioresources.cnr.ncsu.edu/resources/superabsorbent-sponge-and-membrane-prepared-by-polyelectrolyte-complexation-of-carboxymethyl-cellulosehydroxyethyl-cellulose-al3/ ; XP055855630 ; [retrieved on Oct. 27, 2021]; 8, 14, 15; section "Materials";figure 5.
Demirci Sahin et al, "Polymeric Composites Based on Carboxymethyl Cellulose Cryogel and Conductive Polymers: Synthesis and Characterization", Journal of Composites Science, vol. {0} 4, No. {0} 2, Mar. 29, 2020 (Mar. 29, 2020), p. 33, XP055855673 ; DOI: 10.3390/jcs4020033 external link; 8, 14, 15; section 2.1;figure 3.

* cited by examiner

SYSTEM AND METHOD FOR NMR ANALYSIS OF A PHYSIOLOGICAL CONDITION IN AN ANALYTE

TECHNICAL FIELD

The disclosure relates to a system and a method of analysing a physiological condition in an analyte. In particular, the disclosure pertains to systems, components of such systems, and methods of analysing a physiological condition in an analyte using hyperpolarization (HP) and magnetic resonance (MR) techniques.

BACKGROUND OF THE DISCLOSURE

Hyperpolarization-enhanced Magnetic Resonance (MR) techniques, such as Dynamic Nuclear Polarization (DNP), are shown to enhance MR scans' sensitivity by more than 10,000 times, thereby allowing in-situ metabolomic analysis to be carried out in various types of samples and analytes.

Examples of targets or analytes include healthy and diseased cells of human or animal organs and tissues, human or animal cells (or cell fragments), organoids, corporal fluids from humans or animals and whole animals as well as cells and fluids from vegetables. It has to be understood that by animals we are referring to animals such as but not limited to human beings, but also animal beings, such as rats, rabbits, pigs, and mice.

Conventional cell culture methods have been valuable for many years since they provided a way to study cell-cell interactions and tissue physiology without using laboratory animals or human subjects. One of the main obstacles that conventional cell culture presents is the morphology and spatial configuration of the cells. To get the cells to survive in the culture, they are seeded in culture vessels (flasks and plates) that are treated to force them to attach to the bottom, changing their morphology and their function for the specific cell type.

An aspect of the present disclosure includes developing a non-invasive platform capable of real-time acquisition and analysis of metabolic data pertaining to a physiological condition in a three-dimensional analyte configuration using HP and MR techniques, in particular suitable for drug toxicity studies, and/or clinical diagnosis. The non-invasive nature of the novel platform offers the possibility of studies that are not possible with some conventional methods and will advance the development of functional person-specific drug testing systems.

In this document, with a physiological condition is meant the health or unhealth (or disease) states as well as any transition state from health to unhealth (or disease) of the target/analyte or the health or unhealth (or disease) states as well as any transition state from health to unhealth (or disease) of the whole human or animal being or of the human or animal being from whom those targets or analytes were taken.

SUMMARY OF THE DISCLOSURE

Accordingly, in a first, major example, a system for determining a physiological condition in at least one analyte using hyperpolarized (HP) nuclear magnetic resonance (NMR) is used, with the system including at least the following components:
  a hyperpolarization (HP) preparation apparatus structured to hyperpolarize a substrate agent;
  a microfluidic device provided with at least one measuring chamber structured to accommodate a sample matrix containing the analyte, the microfluidic device being structured to infuse the at least one analyte accommodated in the sample matrix with the hyperpolarized substrate agent;
  an NMR apparatus at least including a housing defining a target area for accommodating at least the analyte with the hyperpolarized substrate agent, as well as at least one magnet unit and at least one magnetic gradient unit for applying—during use—one or more magnetic field gradients in the target area, and at least one radiofrequency (RF) pulse generation unit for applying one or more sets of RF pulses towards the target area, and an RF receiving unit for acquiring signals; and
  a computer processing unit for determining the physiological condition in the analyte by analysing the acquired signals.

With this example, a versatile platform is created, capable of real-time acquisition and analysis of metabolic data pertaining to a physiological condition in an analyte using HP and MR techniques in a non-invasive manner. For example, with this platform the development of more-advanced functional person-specific drug testing systems can be achieved.

In a preferred implementation of this platform, the NMR apparatus is structured to accommodate in its target area the microfluidic device with the sample matrix containing the hyperpolarized substrate agent and the analyte accommodated in the measuring chamber thereof. Thus, this allows for a more standardized and reproducible analysis technique, capable of processing and handling multiple samples of identical or different analytes with a hyperpolarized substrate agent in a batch-like and in-line manner.

In further examples of the system, the hyperpolarization (HP) preparation apparatus may be a dynamic nuclear polarization (DNP) apparatus or a para-hydrogen induced polarization (PHIP) apparatus. In further examples of the system, the hyperpolarization (HP) preparation apparatus may include a chemical-induced dynamic nuclear polarization (CIDNP) apparatus, an Overhauser DNP (dynamic nuclear polarization) apparatus, a Signal Amplification by Reversible Exchange (SABRE) apparatus, or a Spin Exchange Optical Pumping (SEOP) apparatus.

In examples, a hyperpolarizing (HP) preparation apparatus structured to hyperpolarize a substrate agent may include an apparatus such as but not limited to: a dynamic nuclear polarization (DNP) apparatus, a para-hydrogen induced polarization (PHIP) apparatus, a chemical-induced dynamic nuclear polarization (CIDNP) apparatus, an Overhauser DNP (dynamic nuclear polarization) apparatus, a Signal Amplification by Reversible Exchange (SABRE) apparatus, or a Spin Exchange Optical Pumping (SEOP) apparatus.

In examples of the methods described herein, a hyperpolarization step may include a hyperpolarization method such as but not limited to: d-DNP (Dissolution Dynamic Nuclear Polarization); PHIP (Para-Hydrogen Induced Polarization); CIDNP (Chemical induced dynamic nuclear polarization); SABRE (Signal Amplification by Reversible Exchange); and SEOP (Spin Exchange Optical Pumping).

In order to emulate a physiologically relevant cellular micro-environment for the analyte under test, the at least one measuring chamber is in fluid communication with a matrix perfusion supply line for supplying a matrix perfusion medium to the measuring chamber, a hyperpolarized substrate agent supply line for supplying the hyperpolarized substrate agent to the measuring chamber as well as a chamber exit line. This configuration of the microfluidic device guarantees a proper environment for analytes (such as cells). The measuring chamber serves as a cage incubation enclosure that maintains a stable environment as to temperature and gas composition and provides the necessary sterile conditions for performing the method according to the disclosure.

In particular, the hyperpolarized agent supply line is located at a position above a position of the matrix perfusion supply line with respect to a bottom wall of the measuring chamber and the chamber exit line is positioned at a position lower than that of the hyperpolarized substrate agent supply line and at a position higher than that of the matrix perfusion supply line with respect to the bottom wall of the measuring chamber. Preferably the matrix perfusion supply line is positioned at the bottom wall of the measuring chamber.

Accordingly, a continuous flow of matrix perfusion medium (culture medium) through the measuring chamber is allowed as well as the injection of the hyperpolarized substrate agent for the analyte to be analysed.

Preferably, the microfluidic device includes a temperature control unit for maintaining the analyte with the hyperpolarized substrate agent at body temperature when accommodated in the NMR apparatus. Herewith, the optimal measurement conditions mimicking a human or animal body are achieved and maintained. In a particular example, the temperature control unit includes a water circulating circuit.

In a preferred example, to establish a standardized and reproducible analysis technique, capable of processing and handling multiple samples of identical or different analytes with a hyperpolarized substrate agent in a batch-like and in-line manner, the microfluidic device is provided with multiple measuring chambers, each measuring chamber being in fluid connection with the hyperpolarized agent supply line. Herewith it is enabled that all measuring chambers containing (a sample matrix with) an analyte receive the same amount of hyperpolarized substrate agent.

According to the disclosure herein, the system may provide real-time acquisition and analysis of metabolic data pertaining to a physiological condition in an analyte. In order to process such large quantities of data in real-time and to provide a more efficient and accurate analysis technique that is less susceptible to noise, the computer processing unit of the system is structured to analyse at least the acquired signals using one or more machine learning algorithms.

Preferably, the machine learning algorithm is a computer-implemented artificial neural network, and the computer processing unit furthermore includes a training unit configured to train the computer-implemented artificial neural network with sequences of signals over time characterizing a training sequence of signals over time with known physiological conditions in an analyte with a hyperpolarized substrate agent; and to apply to the computer-implemented artificial neural network sequences of input signals characterizing at least a test sequence of signals over time with an unknown physiological condition in an analyte with a hyperpolarized substrate agent; and to analyse each applied test sequence of signals over time to generate a predicted physiological condition in an analyte with a hyperpolarized substrate agent for each test sequence of signals over time.

Optionally, during the computer-implemented artificial neural network training, the method may further encompass the outputting of the predicted physiological condition to verify the accuracy and allow adaptation of the training steps.

Using a trained artificial neural network allows for a proper, correct determination of a predicted physiological condition. The artificial neural network can be trained on the basis of machine learning techniques, preferably using deep learning techniques. An example of a deep learning technique can be back propagation. The inputted training data used may be MR acquired images, annotated by clinical experts showing a physiological condition in an analyte (e.g., a cell).

Accordingly, the computer processing unit may include an output unit configured to output the physiological condition in the analyte being determined.

The disclosure hereof also pertains to a method for determining a physiological condition in an analyte with a hyperpolarized substrate agent using the system according to any one or more of the preceding descriptions. The method may include the steps of:

a) providing at least one analyte;
b) infusing the at least one analyte with a hyperpolarized substrate agent;
c) applying one or more magnetic field gradients to the analyte with the hyperpolarized substrate agent positioned in a target area of an NMR apparatus using at least one magnet unit and at least one magnetic gradient unit of the NMR apparatus;
d) applying one or more sets of RF pulses towards the target area using at least one radiofrequency (RF) pulse generation unit of the NMR apparatus;
e) receiving from an RF receiving unit of the NMR apparatus a sequence of NMR signals over time in response to the one or more magnetic field gradients being applied;
f) generating one or multiple time-frequency representations of the sequence of NMR signals by time-frequency transformation, and
g) analysing the time-frequency representations using one or more machine learning algorithms for determining a physiological condition in the analyte.

It should be noted, according to the disclosure hereof, that the preparation of the analyte being provided in step a) can be accommodated in a sample matrix emulating a physiologically relevant cellular micro-environment for the analyte under test.

In a preferred example of the method according hereto, the at least one analyte may be positioned in the target area of the NMR apparatus prior to step b) of infusing the at least one analyte with a hyperpolarized substrate agent. Accordingly, the infusion step b) may take place in the NMR apparatus.

In another example of a method hereof, the at least one analyte may be positioned in the target area of the NMR apparatus after the step b) of infusing the at least one analyte with a hyperpolarized substrate agent. Accordingly, the infusion step b) may take place outside the NMR apparatus and in this example of the method, the at least one analyte together with the hyperpolarized substrate agent may be positioned in the target area of the NMR apparatus.

The time-frequency transformation of step f) may be selected from the group exemplified by but not limited to Fourier transform, whereas the one or more machine learning algorithms may be selected from the group exemplified by but not limited to an artificial neural network, a decision tree, a regression model, a k-nearest neighbour model, a partial least squares model, a support vector machine, or an ensemble of the models that are integrated to define an algorithm.

In particular, the machine learning algorithm may be a computer-implemented artificial neural network, and analysing step g) may be preceded by the steps of:

i) training the computer-implemented artificial neural network with sequences of NMR signals over time characterizing a training sequence of NMR signals over time with known physiological conditions in an analyte with the hyperpolarized substrate agent;

ii) applying to the computer-implemented artificial neural network sequences of NMR input signals over time characterizing at least a test sequence of NMR signals over time with an unknown physiological condition in an analyte with the hyperpolarized substrate agent;

iii) analysing each applied test sequence of NMR signals over time to generate a predicted physiological condition in an analyte with the hyperpolarized substrate agent for each test sequence of NMR signals over time.

In a further example, whilst performing the method according hereto, the receiving step b) can be preceded by the step of iv) hyperpolarizing the substrate agent in a hyperpolarizing (HP) preparation apparatus, and in a further functional implementation after step b), but prior to step c), the method further includes the step of b1) maintaining the analyte with the hyperpolarized substrate agent at body temperature.

For example, the method of the present disclosure can be embodied in a computer program or product, which computer program or product includes computer-coded instructions which, when the computer program or product program is executed by a computer, such as a laptop or a computer, cause the computer to carry out steps of the computer implemented method disclosed herein.

In a particular implementation, a computer-readable storage medium is proposed including computer-coded instructions stored therein, which computer-coded instructions, when executed by a computer, causes the computer to carry out steps of a computer implemented method disclosed in this application. Such computer-readable storage medium can be a (solid-state) hard drive, a USB drive, or a (digital) optical disc.

In another part of the disclosure, a sample matrix for accommodating an analyte for in vitro analysis is proposed. The sample matrix formed as a three-dimensional construct including open pores, and the construct being a gel at least including sodium carboxymethyl cellulose.

In particular, the gel may at least include 0.5-5% (wt.) sodium carboxymethyl cellulose (CMC), in particular 1% (wt.) sodium carboxymethyl cellulose.

Accordingly, an open, three-dimensional construct may be formed from 1% CMC cryogel, which construct serves as a sample matrix for accommodating multiple cells or analytes within its open inner space. Such 1% construct has a good stability and pore size distribution. In particular it has been found that the 1% CMC cryogel has a low affinity for cell attachment and good physical-chemical properties for NMR applications. Thus the open construct of the sample matrix provides optimal conditions mimicking a human or animal body, allowing the cells' structure to live and allowing them to form spheroids (a three-dimensional configuration) and interact with each other instead of the gel material.

BRIEF DESCRIPTION OF THE DRAWINGS

The disclosure will now be discussed with reference to the drawings, which show in.

DETAILED DESCRIPTION OF THE DRAWINGS

Figure 1:
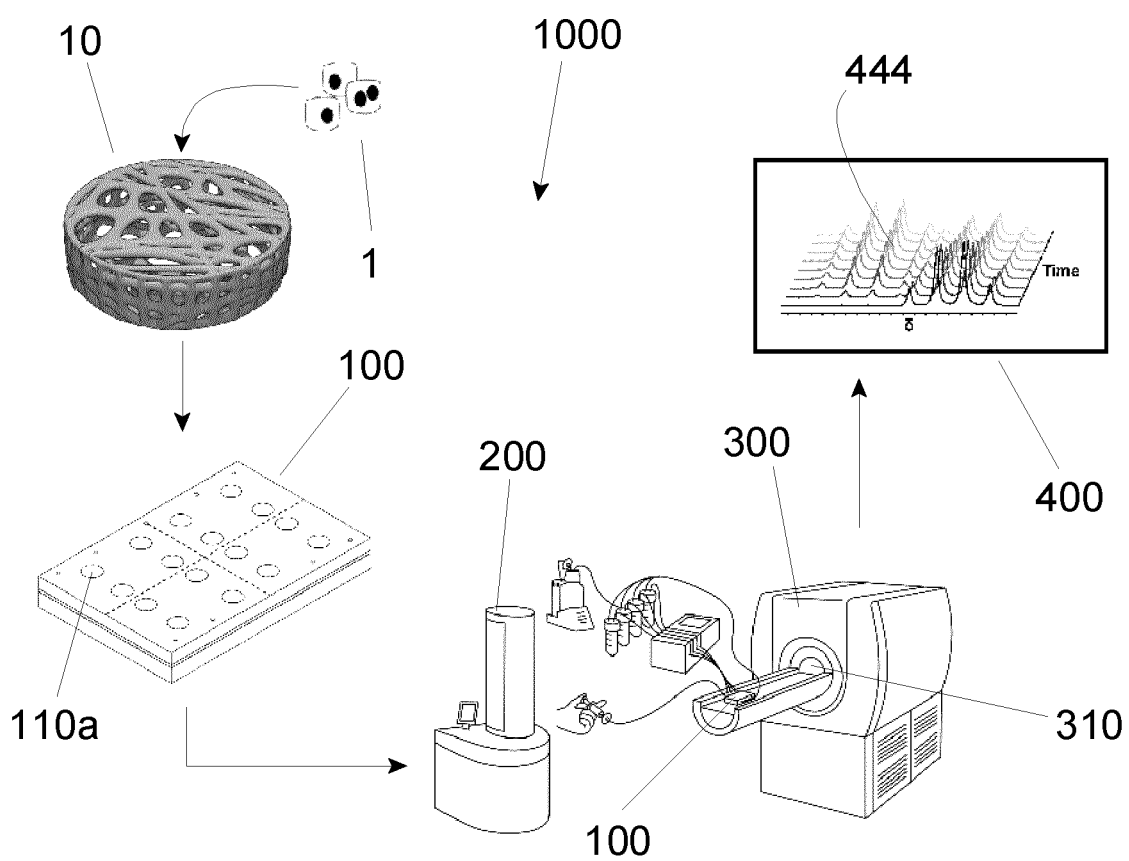
FIG. 1 an example of a system according to the disclosure implementing an example of a method according to the disclosure.

For a proper understanding of the disclosure, in the detailed description below corresponding elements or parts of the disclosure will be denoted with identical reference numerals in the drawings.

In FIG. 1, a first example of a system hereof is shown. The example of FIG. 1 is schematic and not to scale, and the main components of the system are shown in their interrelation functionality. Each component will be discussed in more detail and in more variation in relation to other FIGS.

The system hereof, for determining a physiological condition in at least one analyte using hyperpolarized (HP) nuclear magnetic resonance is denoted with reference numeral 1000. The system in short includes at least the following components:

a microfluidic device 100 provided with at least one measuring chamber 110a structured to accommodate a sample matrix 10 containing the analyte 1;

a hyperpolarizing (HP) preparation apparatus 200 structured to hyperpolarize a substrate agent;

an NMR apparatus 300 at least including a housing defining a target area 310 for accommodating at least the analyte 1 with the hyperpolarized substrate agent 6, a computer processing unit 400 for determining the physiological condition in the analyte 1 by analysing the acquired signals.

In the next paragraphs of the description, the several components of the system 1000 will be described in more detail.

Figure 2A:
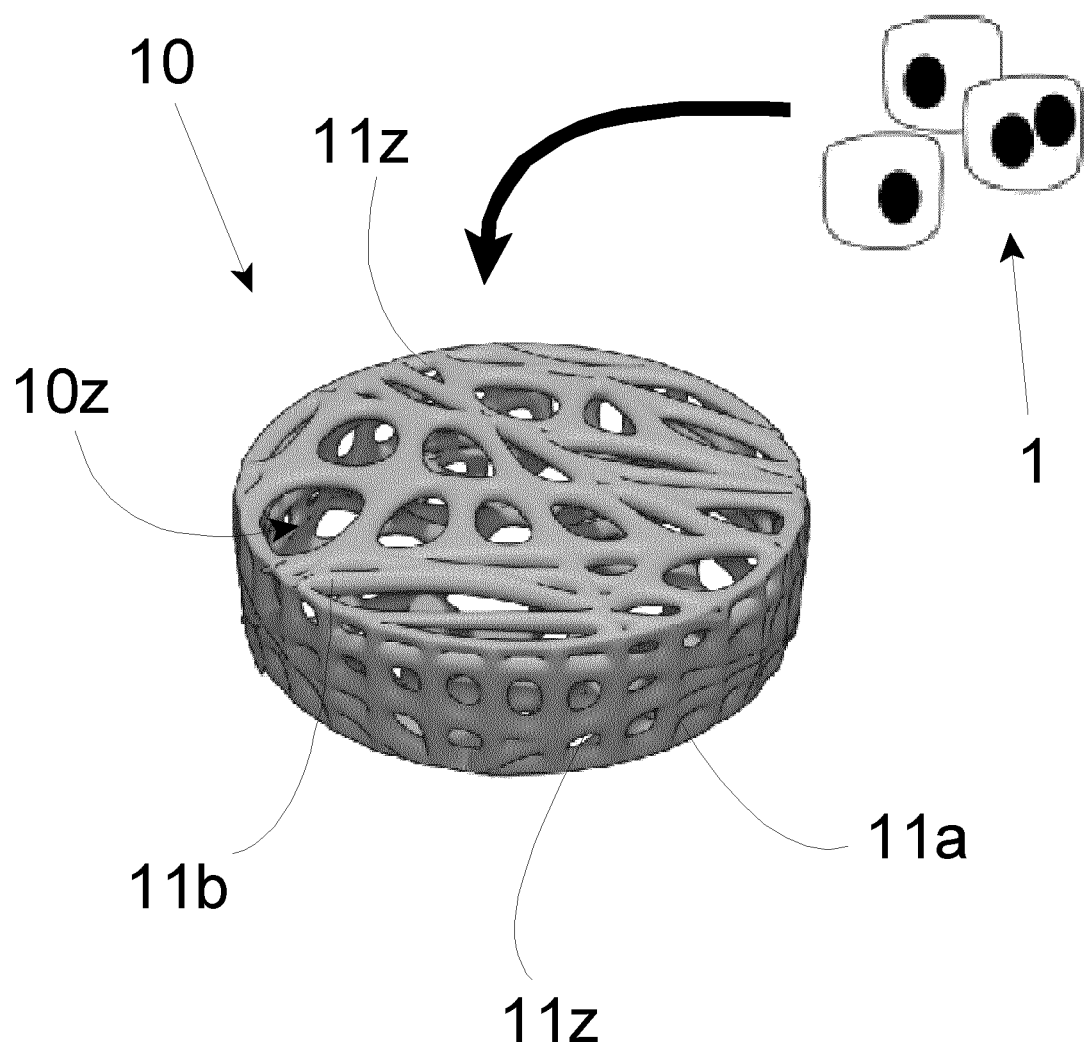
FIGS. 2-6 (as defined by respective sub-FIGS. 2a, 2b, 2c, 2d, 3a, 3b, 3c, 3d, 3e and FIGS. 4, 5 and 6) detail several components of the system according to the disclosure herein.

FIG. 2a depicts an advantageous alternative for the conventional cell culture methods as they have been used for many years. Also, with this alternative, an effective way to study cell-cell interactions and tissue physiology is feasible without using laboratory animals or human subjects. One of the main obstacles that conventional cell culture presents is the morphology and spatial configuration of the cells. To get the cells (or analytes in this description) to survive in the culture, they are seeded in culture vessels (flasks and plates) that are treated to force them to attach to the bottom, changing their morphology and their function for the specific cell type.

Reference numeral 10 in FIG. 2a denotes a sample matrix for accommodating one or more analytes or cells (denoted with reference numeral 1 throughout the description herein) in a three-dimensional configuration for in vitro analysis. According hereto, the sample matrix 10 is formed as a three-dimensional construct in this particular alternative. The three-dimensional construct of the sample matrix 10 envelops a space 10z in which a cluster of individual analytes or cells 1 are accommodated.

As shown in FIG. 2a the three-dimensional construct of the sample matrix 10 is formed from a gel constituting a mesh or a criss-crossed lattice pattern of interconnecting gel strands 11a-11b with open pores 11z in between. The open pores 11z are of an irregular shape and size distribution.

The gel of the open, three-dimensional construct of the sample matrix 10 at least includes sodium carboxymethyl cellulose and preferably at least includes 0.5-5% (wt.) sodium carboxymethyl cellulose, in particular 1% (wt.) sodium carboxymethyl cellulose.

The following method steps describe in detail each step required for the proper synthesis of 1% carboxymethyl cellulose gel. As basic, starting ingredients for fabrication, the 1% carboxymethyl cellulose gel are used:

- Sodium carboxymethyl-cellulose (CMC) [419273, Sigma]
- Adipic acid dihydrazide (AAD) [MW.=174.2 g/mol]
- Morpholino-ethane-sulfonic acid (MES) [MW.=195.2 g/mol], and
- N-(3-Dimethylaminopropyl)-N'-ethylcarbodiimide hydrochloride (EDC) [E7750-10g, Sigma]

In a first step, an MES buffer having a pH 5.5 and 0.5 M is prepared. For 100 ml, the steps are:
1. Prepare 80 ml of distilled $H_2O$ in a container
2. Add 9.76 g of MES free acid to the 80 ml of distilled $H_2O$ solution
3. Adjust the solution to a pH 5.5 using NaOH. For 100 ml, it may be required to add 366 mg of NaOH (solid) or 9.15 ml of NaOH 1 M to the distilled $H_2O$ solution.
4. Add additional distilled $H_2O$ until the volume of the solution has reached 100 ml.

In detail:

| MES | NaOH | distilled $H_2O$ |
|---|---|---|
| 9-76 g | 366 mg | Adjust to 100 ml |

5. Subsequently, store the solution obtained in step 4 at 4° C.

Next, a polymer premix is prepared (1.1 ml):
6. CMC 1% (w/v) is provided, and 50 mg thereof is dissolved in 5 ml of distilled $H_2O$, using stirring (e.g., with a magnetic stirrer at 900 rpm)
7. 100 μL of AAD (50 mg/ml) is added to 1 ml of the CMC 1% solution and mixed by pipetting.
8. This premix is pre-cooled at 4° C.
9. 4 mg of EDC is dissolved in 4 μl of distilled $H_2O$, thus preparing EDC (1 mg/μl).
10. The EDC is added to the premix, and the homogeneity of the solution is ensured by pipetting.

In detail:

| CMC 10 mg/mL (1%) | MES pH 5.5, 0.5M | d-$H_2O$ | EDC (1 mg/mL) |
|---|---|---|---|
| 1 mL | 100 mL | 7 mL | 4 mL |

11. Next, transfer the gel is transferred rather quickly to the mould and incubated.

In the event that the mould has a large volume, the mould is pre-cooled in a freezer at −20° C. before the gel is added, thus:
12. Incubate at −20° C. The mould containing the gel is to be placed in a freezer for 24 hours. After that time, the cryogel is to be removed carefully from the mould.

Accordingly, an open, three-dimensional construct is formed from 1% CMC cryogel, which construct serves as a sample matrix 10 for accommodating multiple cells or analytes 1 within the open, inner space 10z. In particular, it has been found that the 1% CMC cryogel has a low affinity for cell attachment. Thus the open construct of the sample matrix 10 provides optimal conditions mimicking a human or animal body, allowing the cells' structure to live and allowing them to form spheroids and interact with each other instead of the gel material.

An example of a sample matrix 10 obtained with the preparation technique described above has a diameter of 5 mm and a height of 2 mm. More preferably, the dimensions of the sample matrix 10 can be in the range of 3-10 mm in diameter and in the range of 1-6 mm in height, depending on the intended application.

Figure 2B:
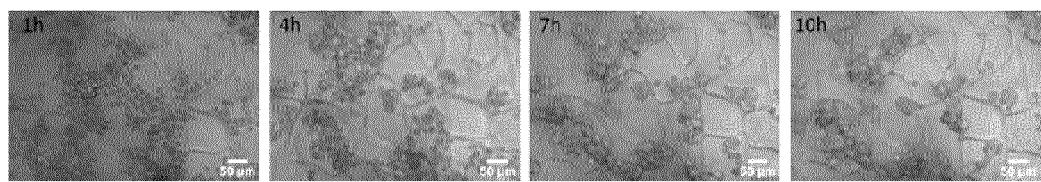

The sample matrix 10 increases the cell viability and optimizes the metabolic conditions required to study, for example, hepatocyte metabolism. In an example, as depicted in FIG. 2b, AML12 cell line was used, including non-cancerous mouse hepatocytes, to study cell aging under laboratory conditions. It was observed that 13 h after seeding the cells 1 in the cryogel sample matrix 10, the formation of spheroids could already be observed. The open, three-dimensional construct of the sample matrix 10 ascertains that cells 1 are retained inside the inner space 10z by the interconnecting cryogel strands 11a-11b with open pores 11z between them, and cells 1 aggregate on their own.

In addition, it should be mentioned that the sample matrix 10 made from the CMC material as disclosed above, does not interfere during the NMR signal acquisition and allows the correct perfusion of the hyperpolarized substrate.

In FIG. 2b, the cryogels were seeded with a million cells and immediately placed inside a microscope for longitudinal imaging. Spheroid formation was observed starting three hours after cell seeding and up to 10 hours later.

Cryopreservation of cells has traditionally been done in cell suspension. With this known technique, cells would be cultured in a 2D system until they are stress-free and before they cover the bottom of the flask in which they are cultured. Usually, the cells are poured into a freezing media (e.g., containing serum and DMSO as a cryopreservant) of, for example, −80° C. Some 12-24 hours later, the pre-cooled cells would be moved to the nitrogen tank for preservation. When thawed, the cells are cultured back in 2D conditions. However, this process requires 3-4 days before the cells can be used in experimental set-ups.

In order to explore the possibility of preservation of multiple 3D sample matrix' 10 containing the analyte 1 previous to the diffusion with the hyperpolarized substrate agent 6 and measuring with the NMR apparatus 300; the 3D sample matrix 10 containing the analyte is structured to be frozen sub-zero temperatures and to be kept at that temperature for several days. Surprisingly, the 3D sample matrix 10 containing the analyte 1 is able to maintain the analyte 1 in good condition even after a defrost cycle without affecting or damaging the analyte 1. Viability and metabolic assays confirm that the analyte remain functional after a defrost process without requiring a cell culturing room or incubator to use the system.

Figure 2C:
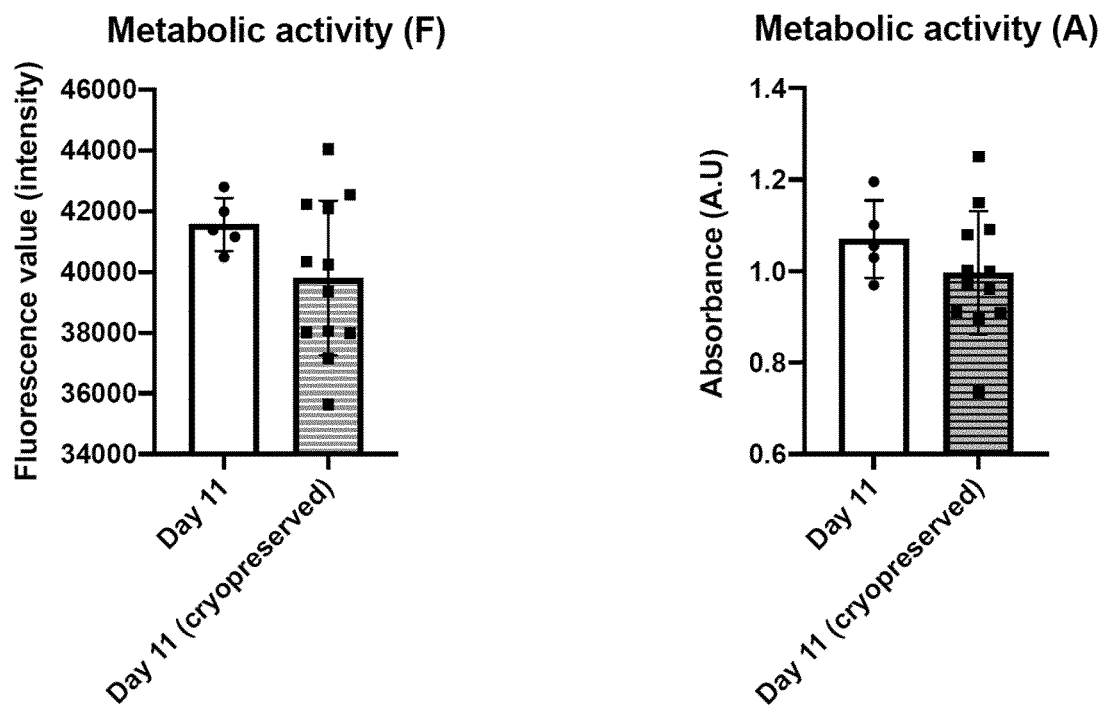

As an example of the functionality of the sample matrix 10 according to the disclosure for maintaining an analyte 1 in good condition even after a defrost cycle and without affecting or damaging the analyte, FIG. 2c depicts metabolic results obtained from an Alamar Blue test showing that cells remain alive inside the cryogel construct after cryopreserving them inside the construct for a period up to 11 days with similar viability to those that did not undergo the cryopreservation process. The results are shown both in fluorescence and absorbance readings for the Alamar Blue test, two outputs from the same metabolic test.

Figure 2D:
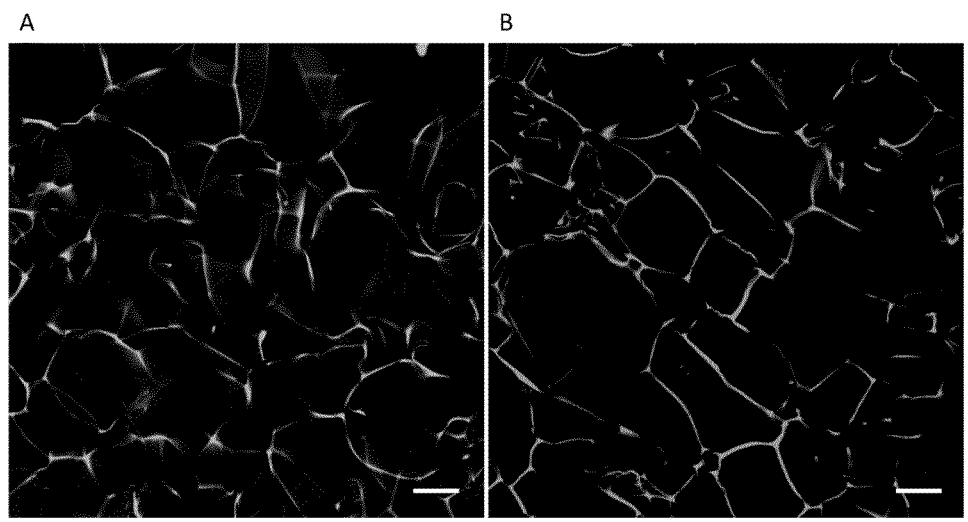

Furthermore, FIG. 2d shows (with a scalebar of 100 μm) in two confocal microscopy images A and B of the inner side of the cryogels the structural integrity before and after undergoing cryopreservation. FIG. 2dA (left) shows the cryogel of the sample matrix 10 imaged before the cryopreservation process, whereas FIG. 2dB (right) shows the cryogel of the sample matrix 10 imaged after the cryopreservation process. As it can be observed, no damage to the cryogel fibers 11a-11b has occurred during the cryopreservation, thus conserving the structural integrity of the 3D, open construct of the sample matrix 10.

The results of FIGS. 2c and 2d show evidence that cells/analytes 1 can be seeded in a cryogel construct as depicted in FIG. 2a and cryopreserved in liquid nitrogen after 24 hours. The tests show a high viability up to 11 days post-thawing, compared to results of cryogels that did not undergo cryopreservation. Additionally, the cryogel construct can sustain the cryopreservation process after seeding of cells/analytes 1, keeping their structural integrity, which is essential for undergoing the subsequent infusion with the hyperpolarizing substrate agent 6, and the NMR data acquisition.

Figure 3A:
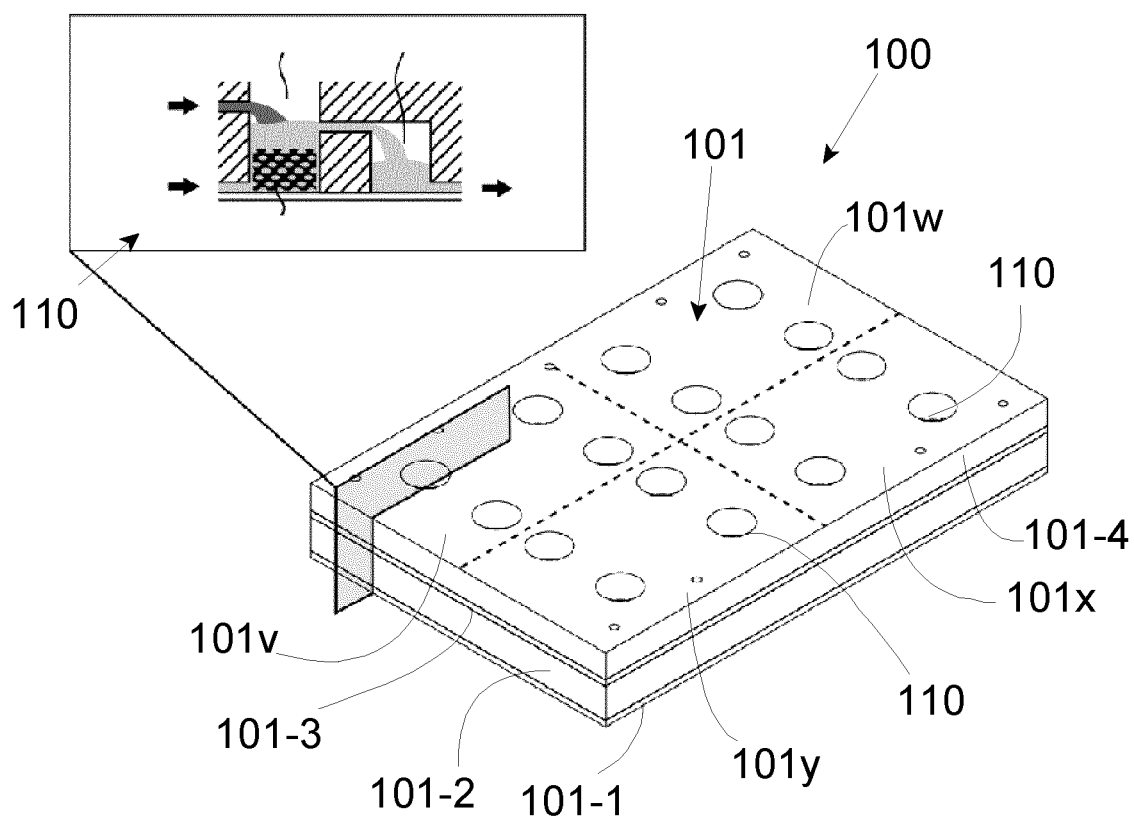
Figure 3B:
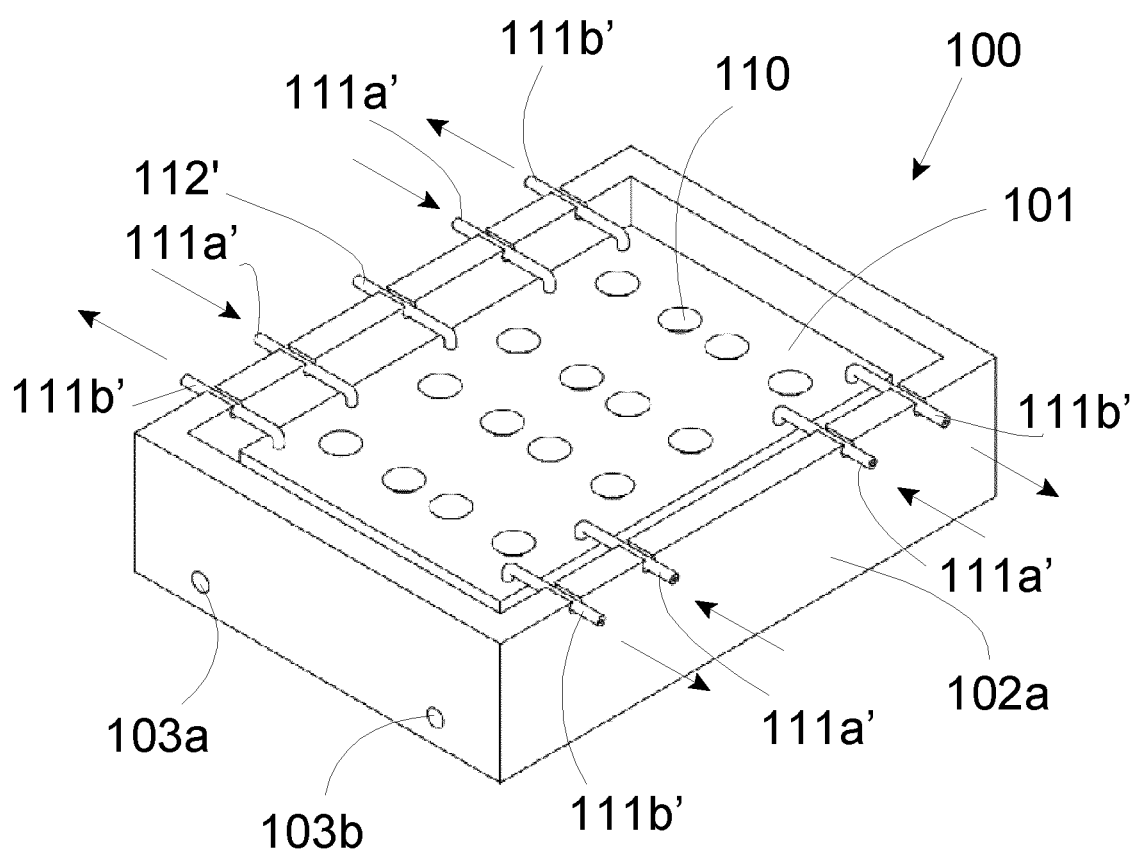
Figure 3C:
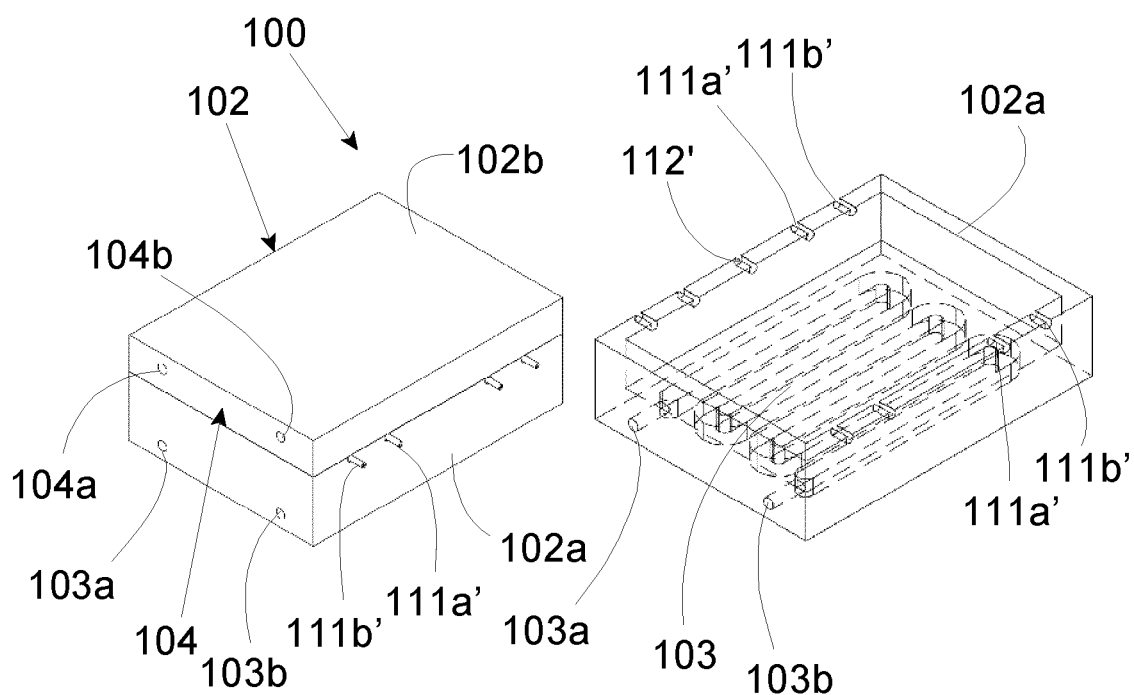

FIGS. 3a and 3b depict in more detail a further component of the system hereof.

Reference numeral 100 denotes the component of the system being a microfluidic device. In an example, the microfluidic device 100 includes a stack of structures, denoted with reference numerals 101, 102, and 104. Reference numeral 101 describes a substrate structure of multiple (e.g., three) polydimethylsiloxanes (PDMS) layers 101-2, 101-3 and 101-4 deposited on a glass slide 101-1. A typical and suitable dimension of the glass slide is 75×50 mm. This can be changed to accommodate the dimensions of the NMR apparatus.

FIG. 3b details the microfluidic device 100 in more detail and in particular details one single microfluidic element 110, mounted on the substrate structure 101. Preferably, the microfluidic device 100 includes a plurality of such microfluidic elements 110, each being provided such well or measurement chamber 110a for individually accommodating a sample matrix 10 with analytes 1.

As shown in FIG. 3a, the substrate structure 101 includes several quadrants or arrays 101v-101w-101x-101y (here four arrays). Each array 101v-101w-101x-101y includes several microfluidic elements 110 of identical configuration, here four. In the example, as shown, the configuration of the substrate structure 101 is includes 4×4 (16) microfluidic elements 110. In the example, each microfluidic element 110 includes a well/measurement chamber 110a with dimensions of 6 mm in diameter D and 10 mm in height H, see FIG. 3d.

Each microfluidic element 110 contains channels 111a and 111b, which are in fluid communication with the well or measurement chamber 110a. Channel 111a denotes a matrix perfusion supply line for supplying a matrix perfusion medium 5 to the measuring chamber 110a. Channel 111b denotes a microfluidic element exit line. Channel 111a and 111b can be provided in a second PDMS layer 101-2 (e.g. of 5 mm thick) on the substrate structure (glass slide) 101.

Furthermore, microfluidic element 110 includes a channel 111c, which functions as the chamber exit line. Channel 111c can be provided in a third PDMS layer 101-3 (e.g. of 1 mm thick).

Channel 112 denotes a hyperpolarized substrate agent supply line for supplying a hyperpolarized substrate agent 6 (e.g., hyperpolarized pyruvate) to the measuring chamber 110a. Channel 112 can be provided in a fourth PDMS layer 101-4 (e.g., of 4 mm thick).

In an advantageous example, the PDMS layers 101-1, 101-2, and 101-3 are manufactured by replica moulding using SU-8 microstructures produced by photolithography on 4-inch sized silicon wafers. The silicon substrates were dehydrated using a hot plate at 200° C. for 30 minutes and afterwards cleaned/activated using an $O_2$ plasma (PDC-002, Harrick Plasma, Ithaca, NY, USA) treatment at 22.5 ml/min and 30 W for 20 minutes. A photoresist material (SU-8 2100, KAYAKU Advanced Materials, Inc., Westborough, MA, USA) was spin-coated to form a SU-8 layer of 200 μm thickness. Also, PDMS prepolymer was prepared in a ratio of 10:1 (base: curing agent, w/w) and degassed in a vacuum desiccator. The prepolymer was then cast on a Petri dish containing the SU-8 mould, backed at 65° C. for four hours, and subsequently left overnight at room temperature. The three PDMS layers together with the glass slide were activated using $O_2$ plasma and bonded together, resulting in a 11 mm thick device.

Figure 3D:
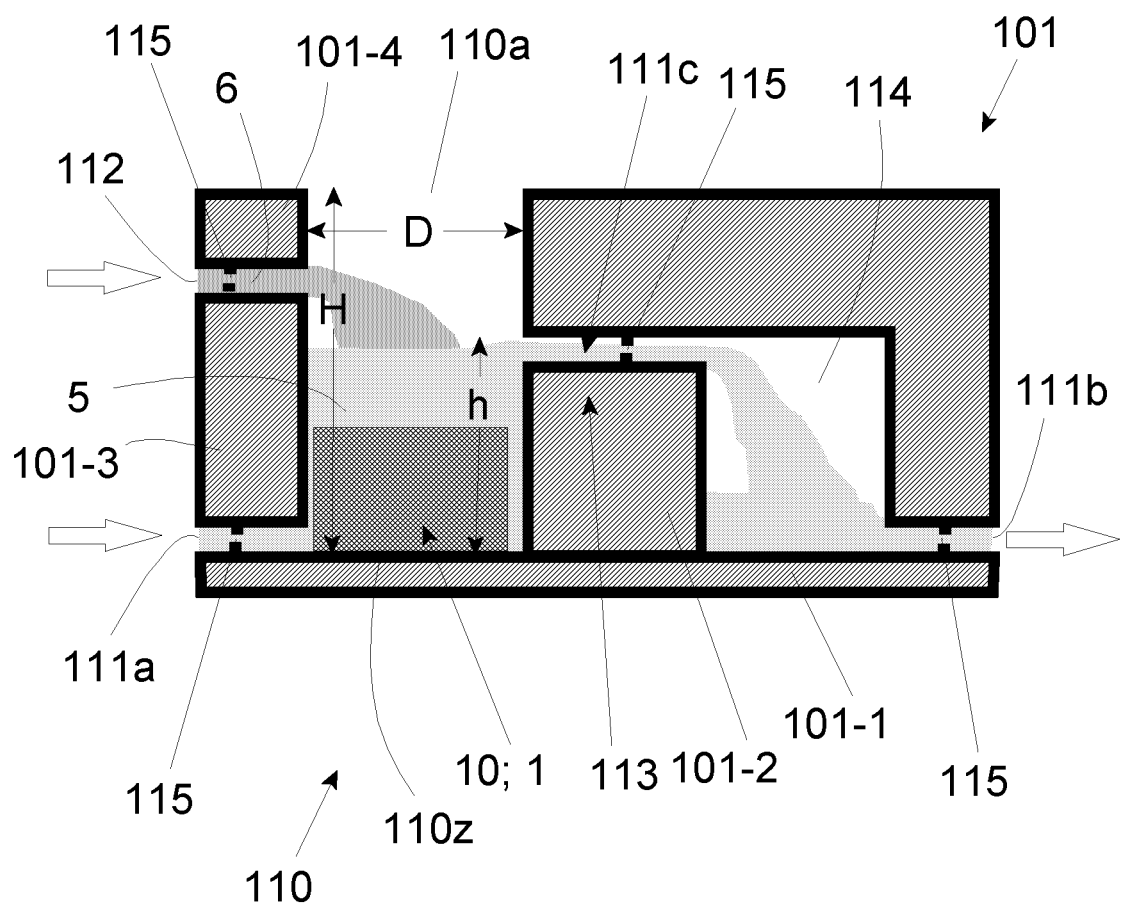

As shown in detail in FIG. 3d, for each microfluidic element 110 of the microfluidic device 100, the hyperpolarized agent supply line 112 is positioned at a position above a position of the matrix perfusion supply line 111a with respect to the bottom wall 110z of the well/measuring chamber 110a. Similarly, the chamber exit line 111c is positioned at a position lower than that of the hyperpolarized agent supply line 112 and at a position higher than that of the matrix perfusion supply line 111a with respect to the bottom wall 110z of the measuring chamber 110a. In particular, the matrix perfusion supply line 111a is positioned at the bottom wall 110z of the measuring chamber 110a and accordingly flushes—during use—the open, porous sample matrix 10 with analytes 1 from the bottom side towards the upper side towards the chamber exit line 111c.

Accordingly, a continuous flow of matrix perfusion medium 5 (culture medium) through the measuring chamber 110a is allowed as well as the injection of the hyperpolarized substrate agent 6 for the analyte to be analysed. In particular, due to the specific height configuration of the several channels 111a-111c-112, chamber exit line 111c withdraws the matrix perfusion medium 5 from the respective well/measurement chamber 110a whilst keeping a constant liquid height h from the bottom 110z of the well 111a. Accordingly, during use, this accounts for ~140 μl of total medium volume per well 110a.

In the example of the microfluidic device 100 four groups of four microfluidic elements 110 (each with a well/measurement chamber 110a) allow for analysing up to four biological samples. As the microfluidic elements 110 are grouped in four independent sets 101v-101w-101x-101y of four wells 110a, each set of four wells/measurement chambers 110a share the culture media 5 via a central matrix perfusion supply line 111a' and a central matrix perfusion exit line 111b'.

Figure 3E:
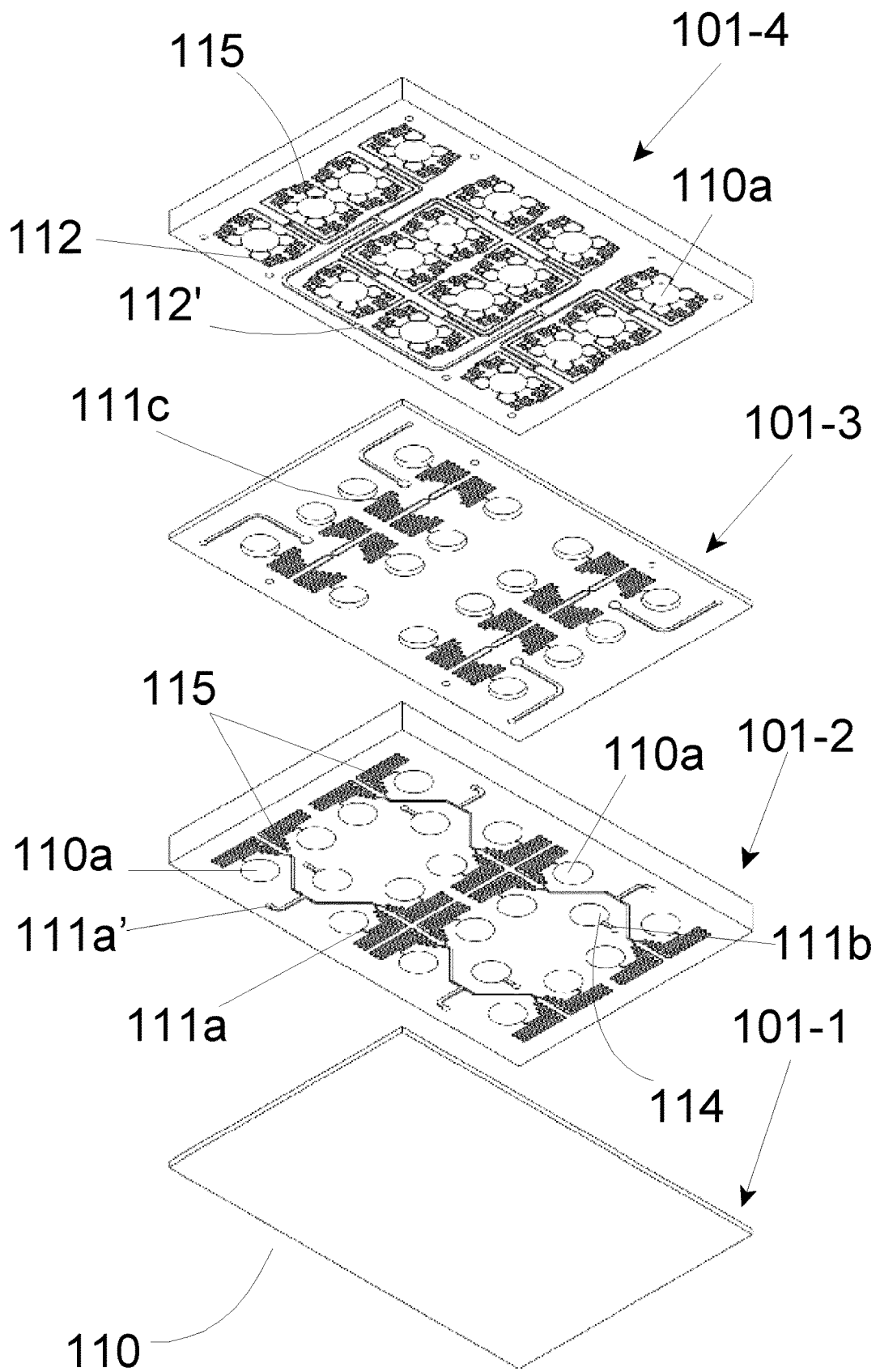

In FIG. 3b, microfluidic resistances 115 are schematically depicted in the microfluidic channels 111a-111b-111c-112 of each microfluidic element 110. Although FIG. 3b depicts these microfluidic resistances 115 being positioned in each microfluidic channels 111a-111b-111c-112, it is sufficient to have a microfluidic resistance 115 in at least one of the matrix perfusion supply line 111a and the microfluidic element exit line 111b. See also FIG. 3e showing in more detail the microfluidic resistances 115 structured as serpentines.

Microfluidic resistances 115 at the inlet 111a and outlet 111b of the well/measurement chamber 110a enable the same flow rate through each well/measurement chamber 110a containing the 3D sample matrix 10 with the analyte 1. Furthermore, all the wells/measurement chambers 110a of a set 101v-101w-101x-101y are linked to an embedded suction reservoir 114 that withdraws the matrix perfusion medium 5. In another example, microfluidic resistances 115 can be placed in each central matrix perfusion supply line 111a' and central matrix perfusion exit line 111b' belonging to each set 101v-101w-101x-101y of microfluidic elements 110.

Since the hyperpolarized agent supply line 112 is positioned at a position above a position of both the matrix perfusion supply line 111a as well as the chamber exit line 111c with respect to the bottom wall 110z of the well/measuring chamber 110a, channel 112 is able to distribute the hyperpolarized substrate agent 6 to all the wells/measurement chambers 110a belonging to the same set 101v-101w-101x-101y. Therefore, isolation between the sets 101v-101w-101x-101y is maintained, allowing the sets 101v-101w-101x-101y each to be infused with the hyperpolarized substrate agents 6, allowing more diverse and versatile analysis.

A proper environment for the analytes 1 is created by accommodating the microfluidic device 100 in an incubation enclosure 102. The incubation enclosure 102 maintains stable temperature and gases ($O_2$ and $CO_2$) as well as sterile conditions while the microfluidic device 110 is handled by operational personnel into the NMR equipment 300.

Accordingly, the microfluidic device 100 includes in its incubation enclosure 102 a temperature control unit 103. The temperature control unit 103 serves to maintain each microfluidic element 110, and accordingly the assembly formed by the 3D sample matrix containing the analyte 1, with the hyperpolarized substrate agent 6 at body temperature. This latter requirement is necessary when the microfluidic device 100 with the several microfluidic elements 110 is accommodated in the NMR apparatus 300. Herewith, the optimal measurement conditions mimicking a human or animal body is achieved and maintained. In a particular example, the temperature control unit includes a water circulating circuit 103 with a water inlet 103a and a water outlet 103b.

The temperature inside the incubation enclosure 102 is controlled by pumping warm water from a water bath into the enclosure base 102a that acts as a water jacket. Otherwise, the enclosure lid 102b has inlet 104a and outlet 104b to achieve a stable gas incubation.

For proper use of the system and method according hereto, sample matrix's 10 as described in relation to FIGS. 2a-2b provided with an analyte sample 1 within the open, porous space 10z are each placed within a well/measurement chamber 110a of each microfluidic element 110 of the microfluidic device 100. Subsequently, the fluidic system includes several microfluidic channels 111a-111-b-111c-112 and allows the continuous flow of culture media 5 through each well/measurement chamber 110a, thereby perfusing each sample matrix 10 with the analytes 1 contained therein.

Figure 5:
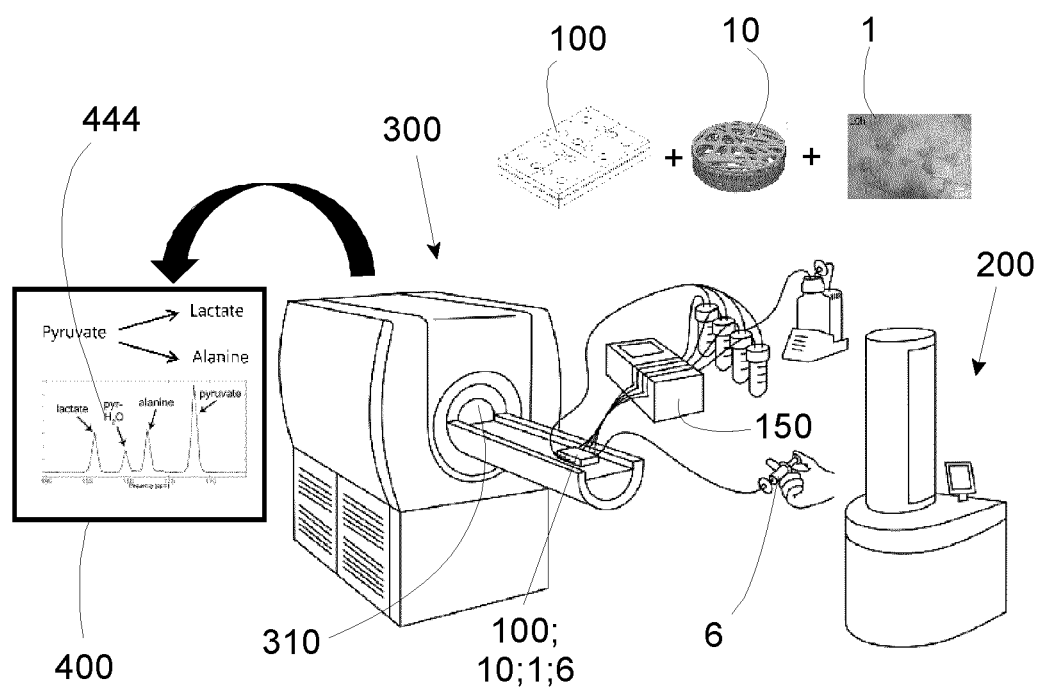

The fluidic system includes a reservoir 114 connected to a vacuum pump and a peristaltic pump (both indicated with reference numeral 150 in FIG. 5). This set-up is replicated for all four sets 101v-101w-101x-101y. The peristaltic pump 150 flows the matrix perfusion medium 5 (culture medium) from and to the reservoir 114 to each well/measurement chamber 110a of the microfluidic element 110 (the device 100) in a reciprocating manner, thus perfusing the sample matrix 10 and the analyte 1. The vacuum pump 150 applies a negative pressure at reservoir 114, and the matrix perfusion medium 5 (culture medium) is sucked out from the microfluidic element 110 via the microfluidic element exit line 111b.

For performing the hyperpolarized-NMR measurement, the peristaltic pump is interrupted, and a specific amount of hyperpolarized (HP) substrate agent 6 (e.g. hyperpolarized C13 labelled pyruvate) as obtained from the hyperpolarizing (HP) preparation apparatus 200 is injected into the specific central hyperpolarized agent supply line 112'. The central hyperpolarized agent supply line 112' splits the specific amount of hyperpolarized (HP) substrate agent 6 into smaller samples, the number of smaller samples of hyperpolarized (HP) substrate agent 6 being conformal to the number of microfluidic elements 110 of the sets 101v-101w-101x-101y.

In this example, the specific central hyperpolarized agent supply line 112' is in fluid communication with each well/measurement chamber 110a of the sixteen microfluidic elements 110. This configuration enables all the wells 110a containing a sample matrix 10 with analytes/cells 1 to receive the same hyperpolarized sample volume 6. For instance, a sample volume of 800 µl would result in 50 µl of hyperpolarized (HP) substrate agent 6 per well 110a/microfluidic element 110.

Because of the porous and the sample matrix fabrication methodology, the open, three-dimensional construct of the sample matrix 10 exhibits a high permeability and permits a rapid distribution of the hyperpolarized (HP) substrate agent 6 through the 3D sample matrix 10 containing the analyte 1. Rapid distribution of hyperpolarized (HP) substrate agent 6 is crucial due to the rapid decay rate of the hyperpolarized (HP) substrate agent 6.

According to certain examples of the system, the hyperpolarizing (HP) preparation apparatus 200 may be a dynamic nuclear polarization (DNP) apparatus or a parahydrogen induced polarization (PHIP) apparatus.

Figure 4:
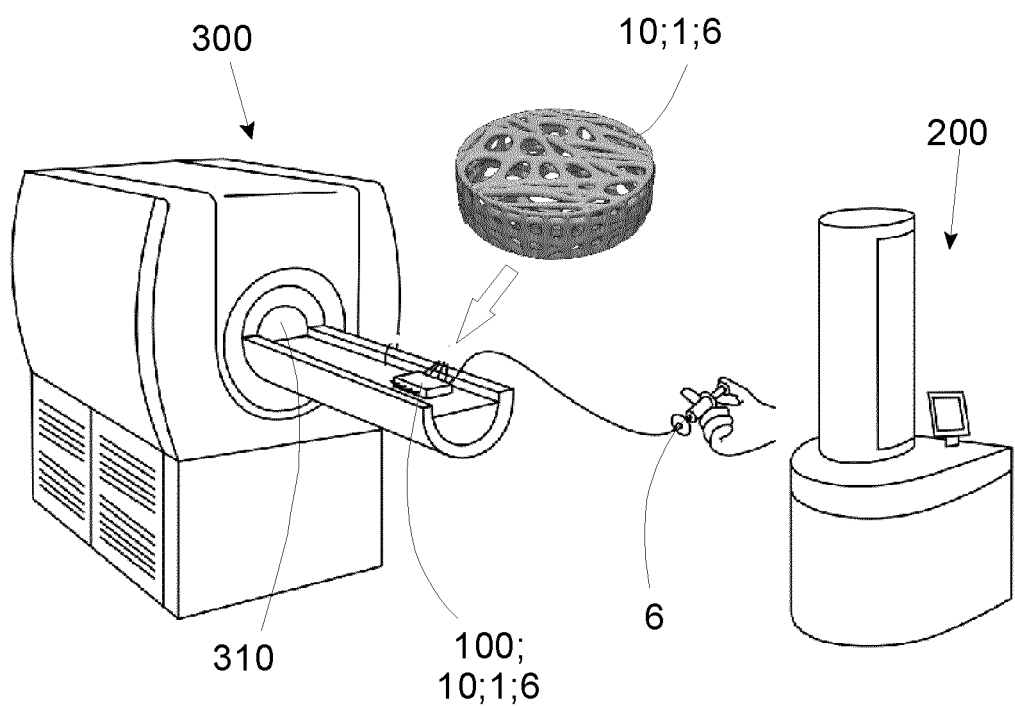

As depicted in FIG. 4, dissolution-DNP is typically performed using two magnet units: one magnet unit 210 is implemented in the hyperpolarizing (HP) preparation apparatus 200 to polarise the substrate agent 6 in a solid-state condition (preferably at a magnetic field strength $B_0$ between 3.4 and 7.0 T), whereas the other magnet unit is that of a dedicated NMR apparatus 300. For a proper data acquisition, current horizontal bore clinical magnet units of the NMR apparatus 300 are typically in the range of 1.5-3 T, although higher fields up to 7 T are now available. High-resolution vertical bore NMR apparatus reach higher fields up to 28.2 T.

The dissolution-DNP process starts with hyperpolarizing the substrate agent 6. An example of the substrate agent is e.g., C13 labelled pyruvate. In addition to the free prepolarising radicals (substance containing unpaired electrons), a glassing agent may be incorporated into the substrate agent 6. Glassing agents, such as glycerol or DMSO, are used to allow glassing of the substrate agent 6 when the substrate agent does not form a glass by itself. This ensures a uniform distribution of the radicals in the analyte 1 and good microwave penetration.

After this preparation step, the substrate agent 6 is to be inserted into the DNP magnet unit 210 of the hyperpolarizing (HP) preparation apparatus 200 and irradiated with microwaves to drive the electron-nucleus polarisation transfer. The polarisation build-up in the solid-state depends on many factors, including the nature and concentration of the radical and the substrate, electron and nuclear relaxation rates, and composition of the frozen mixture. For nuclear polarisation to reach a maximum, it may take several hours. When polarising 13C, the regular DNP enhancement is performed directly irradiating the frozen sample with the appropriate MW frequency for 13C. By using a 6.7 T-DNP magnet at 1.2 K 70% 13C polarisation can be achieved in 20 minutes before dissolution.

Once the polarisation build-up is concluded the hyperpolarized substrate agent, 6 is defrosted into the cryostat using hot water at 180° C. and 10 bar of pressure, obtaining a liquid state hyperpolarized substrate agent finally.

After being hyperpolarized in the hyperpolarizing (HP) preparation apparatus 200, the hyperpolarized substrate agent 6 is then injected into the microfluidic device 100 containing at least one 3D sample matrix 10 with the analyte 1 to be analysed. The microfluidic device 100 with the at least one 3D sample matrix 10 accommodated in a measurement chamber 110a, with the at least one 3D sample matrix 10 containing the analyte 1 with the certain amount of hyperpolarized substrate agent 6 being injected, is subsequently placed into the NMR apparatus 300, where the 13C signal is then acquired (either upon injection into an animal or a test tube).

In an alternative implementation, the microfluidic device 100 with the at least one 3D sample matrix 10 accommodated in a measurement chamber 110a and containing the analyte 1 is placed into the NMR apparatus 300 and subsequently the certain amount of hyperpolarized substrate agent 6 is being injected into the microfluidic device 100 thereby infusing the analyte 1 to be analysed.

As depicted in FIG. 5, in a preferred implementation of this platform, the NMR apparatus 300 is structured to accommodate in its target area 310 the microfluidic device 100 with one or more sample matrix' 10 each containing the analyte 1 infused with the hyperpolarized substrate agent 6 accommodated in the associated measuring chamber 110a. The system 1000 is structured to determine a physiological condition in only one sample of analyte 1 (in fact, a large amount of a specific type of cells or analytes 1) with hyperpolarized substrate agent 6.

In practice, the microfluidic device 100 as described in relation to FIGS. 3a and 3b has multiple (e.g., 4×4) microfluidic elements 110, each structured to accommodate a 3D sample matrix with cells or analytes 1 infused with a certain amount of hyperpolarized substrate agent 6 to be analysed in their associated measurement chamber 110a. Thus, this allows for a more standardized and reproducible analysis technique, capable of processing and handling multiple samples of identical or different analytes 1 using the same amount of hyperpolarized substrate agent 6 simultaneously and in a batch-like and in-line manner.

The NMR apparatus 300 also accommodates at least one magnet unit 310 and at least one magnetic gradient unit (not depicted) for applying—during use—one or more magnetic field gradients $B_0$ in the target area 310. The NMR apparatus 300 furthermore includes in its housing at least one radiofrequency (RF) pulse generation unit (not depicted) for applying one or more sets of RF pulses towards the target area 310 and the one or multiple amounts of hyperpolarized substrate agent 6 with cells or analytes 1.

In order to obtain spectroscopic information 333 from all samples (one or multiple amounts of cells or analytes 1 infused with hyperpolarized substrate agent 6) accommodated in the 3D sample matrix 10 in the measurement chambers 110a of the several microfluidic elements 110 of the microfluidic device 100 simultaneously, RF pulse sequences are generated by at least one radiofrequency (RF) pulse generation unit and applied. These RF pulse sequences provide as much spatially-localized spectral information 333 as possible in a relatively short time-window of data acquisition. It is desirable to obtain as much spectral information as possible in such short amount of time as the polarisation of the hyperpolarized substrate agent 6 decays over time rather quickly.

Traditional pulse sequences, such as echo-planar imaging (EPI) acquire all the necessary information to reconstruct a NMR image in a single data acquisition shot, but no spectral information can be obtained. Echo planar spectroscopic imaging (EPSI) allows to distinguish nuclei processing at different chemical shifts, but since each data acquisition shot acquires partial information only, multiple data acquisition shots are required. Chemical shift imaging (CSI) provides 2D spatial information and a third dimension: the spectral information for each voxel; multiple data acquisition shots are needed.

Recently, single-shot NMR and imaging techniques, such as spatiotemporal encoding (SPEN), allow for chemical shift discrimination in a single spectral data acquisition. Two versions of these pulse sequences appear to be useful in hyperpolarised 13C experiments. One option involves performing localized spectroscopy by exciting a region with the shape of interest. From this selected area, an NMR signal is acquired to get a spectrum that contains all the chemical shifts of the nuclei in the excited region of the sample to be analysed.

The time-sequence set of NMR signals thus generated in the target area is picked up using an RF coil of the RF receiving unit of the NMR apparatus 400. The RF coil converts the change in the magnetic field in the target area 310 as induced by the nuclei's precession in the analytes 1 into electromagnetic current signals 333 and transferred to the computer processing unit 400. The computer processing unit 400 analyses the acquired signals and, based on the analysis, determines the physiological condition in the analyte 1.

Once the data-acquisition after the NMR measurement has been performed, the perfusion system starts again, and the remainder of the hyperpolarized (HP) substrate agent 6 is diluted in the matrix perfusion medium 5.

Figure 6:
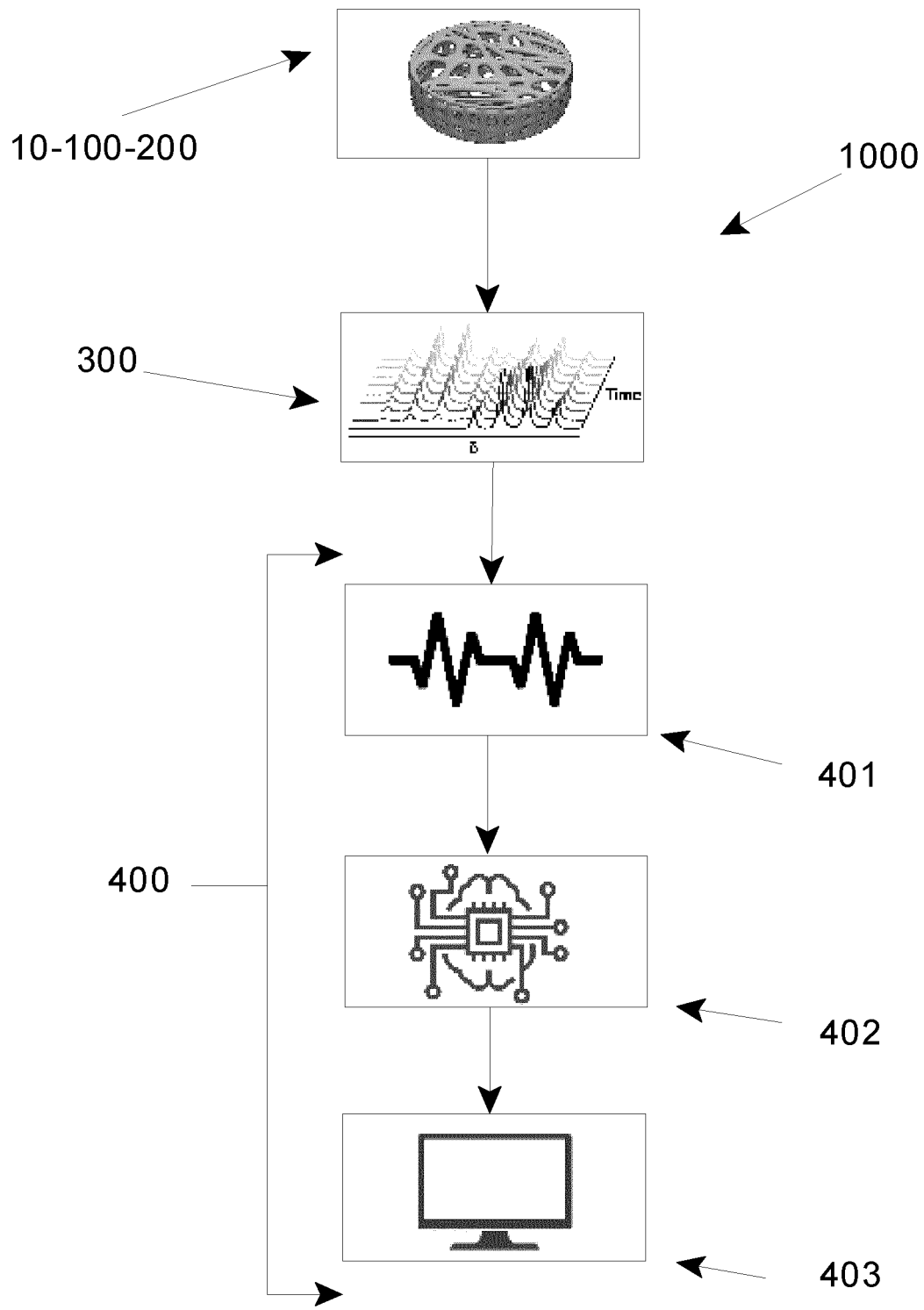

As outlined in FIG. 6, the computer processing unit 400 is structured to analyse at least the acquired signals 333 from the NMR apparatus 300 using one or more machine learning algorithms. Accordingly, the computer processing unit 400 implements a data receiving unit 401, which is structured to acquire from the NMR apparatus 300 the NMR signals as converted in time-dependent electromagnetic current signals. The at least one data receiving unit 401 can be linked to the NMR apparatus 300 using suitable signal wiring for receiving the data stream of time-sequence sets of NMR signals, or through a wireless data-communication interface operating in accordance with a network protocol for exchanging data, such as designated ZigBee™, Bluetooth™, or Wi-Fi based protocols for wireless networks.

In a step of a computer-implemented method hereof, the computer processing unit 400 amplifies and stores time-sequence sets of NMR signals as intensity vs. time (time-domain signal-free induction decay, FID). For this purpose, the computer processing unit 400 utilizes at least one data transformation unit 401, which implements at least one time-frequency transformation algorithm for generating one or multiple time-frequency representations of the time-sequence set of NMR signals. In simple spectroscopic experiments, the NMR signal is zero-filled, Fourier Transformed, and the baseline-corrected. The area under the curve of each peak in the spectrum is calculated, and correction factors may be applied for flip angle or other acquisition particularities. More complicated pulse sequences may require deconvolution of the signal (e.g., SPEN).

The time-frequency transformation 444 of the time-sequence set of NMR signals can be selected from the group exemplified by but not limited to short-time Fourier transform, wavelet transform, filter bank, or discrete cosine transform.

The computer processing unit 400 is structured to analyse the time-frequency representations of the time-sequence set of NMR signals using one or more machine learning algorithms in order to determine the physiological condition in the analyte 1. For illustrative purposes, the one or more machine learning algorithms is denoted with reference numeral 402 in FIG. 6. In an example, the computer processing unit 400 may implement an algorithm processing unit 402 incorporating a computer-readable storage unit (not shown) including computer-coded instructions stored therein, which computer-coded instructions, when executed, perform the machine learning algorithm.

The storage unit of the computer processing unit 400 can be a hard disc unit or a solid state storage unit, or a removable storage device such as a USB storage unit mounted in a laptop or computer implementing computer code performing the computer-implemented method according to the disclosure.

According to the disclosure, the computer processing unit 400, the disclosure can be (part of) a laptop or computer, which may be implementing computer code performing the computer-implemented method according to the disclosure. For example, the method of the present disclosure can be embodied in a computer program or product, which computer program or product includes computer-coded instructions which, when the computer program or product program is executed by a computer, such as a laptop or a computer, cause the computer to carry out steps of the computer implemented method disclosed herein.

In a particular implementation, a computer-readable storage medium is proposed including computer-coded instructions stored therein, which computer-coded instructions, when executed by a computer, cause the computer to carry out steps of the computer implemented method disclosed in this application. Such computer-readable storage medium can be a (solid-state) hard drive, or a USB drive, or a (digital) optical disc.

In an alternative example, the one or more machine learning algorithms 402 can be incorporated within the data transformation unit 401, thus forming a single computational unit performing several distinct steps of the computer-implemented method according to the disclosure.

Once the physiological condition in the analyte 1 is determined, the result may be outputted or displayed via a data output unit 403, for example, a computer or laptop display or a separate display unit 403.

For identifying a physiological condition in a sample of analytes 1 using the one or more machine learning algorithms 402 the acquired MRI images are generated from samples of analytes 1 infused with hyperpolarized substrate agent 6, preferably accommodated in the open, 3D sample matrix 10 positioned in a measurement chamber 110a of the microfluidic device 100 or accommodated in a vial, as these samples have the advantage of a higher sensitivity compared to standard techniques. The developments hereof identify key patterns in the acquired MRI images that serve as indicators for the presence or occurrence of a physiological condition in the analytes 1.

Accordingly, in an example, the machine learning algorithm 402 may include a computer-implemented artificial neural network. In that particular example, the computer processing unit 400 furthermore includes a training unit (not depicted), that is configured to train the computer-implemented artificial neural network 402 with sequences of signals over time, which characterize a training sequence of signals over time with known physiological conditions in an analyte infused with a hyperpolarized substrate agent (this concerns the training data); and to apply to the computer-implemented artificial neural network sequences of input signals characterizing at least a test sequence of signals over time with an unknown physiological condition in an analyte infused with a hyperpolarized substrate agent; and to analyse each applied test sequence of signals over time to generate a predicted physiological condition in an analyte infused with a hyperpolarized substrate agent for each test sequence of signals over time.

In order to assist the training of the computer-implemented artificial neural network 402 NMR/MRI images will first be annotated or labelled by experts. These annotations or labels in these NMR/MRI images will indicate key patterns that correspond to external stimuli responses (such as drugs) to the cells/organs/analytes 1 under question. These labelled key patterns characterize a training sequence of signals with known physiological conditions in an analyte 1 under question with a specific hyperpolarized substrate agent 6.

In an example, these annotations or labels can be colours in the images corresponding to signal intensity, which signal intensity, in turn, points to a certain disease stage, hence pointing to a known physiological condition of the analyte 1 under question correlating with its infusion with a specific hyperpolarized substrate agent 6.

After collecting a statistically significant data cohort of a sufficient amount of such labelled key patterns, the computer-implemented artificial neural network 402 will be trained on these training set of sequence of signals over time and subsequently tested on a validation or test set of sequence of signals over time with an unknown physiological condition in an analyte infused with a hyperpolarized substrate agent. Once the model of the artificial neural network 402 achieves acceptable accuracy, it should be able to automatically indicate key patterns, such as signal intensity in NMR/MRI images, in a new, fresh set of NMR/MRI images and convert them into a data format that can be incorporated into the ongoing data processing, thereby adding additional parameters to improve the quality of the final output.

In further examples, the systems and methods described herein may include the use of other imaging techniques such as but not limited to: PET imaging. In examples, the inputted training images used may include images obtained by other imaging techniques such as but not limited to: positron emission tomography (PET) imaging and other molecular imaging techniques. In such examples, the systems and methods include acquiring images of a sample of analytes 1 with an imaging technique used to obtain images used in the training of the machine learning algorithm 402.

Accordingly, the artificial neural network 402 is able to detect a disease stage (the physiological condition in an analyte to be analysed) if the metabolic changes in the NMR/MRI images correlate with such trained disease stage (e.g., the signal intensity).

One of the key advantages of the system 1000 combining the microfluidic device 100 with the hyperpolarizing (HP) preparation apparatus 200 and the NMR apparatus 300 is the ability to emulate real organs' responses—either from an animal or human origin—to external stimuli under in-vitro conditions. The more precise the emulation, the higher the value of the outcome. The sheer complexity of inputs involved in creating precise emulations and the distinctive nature of the test conditions calls for advanced techniques, requiring the implementation of a computer processing unit 400 utilizing one or more computer-implemented artificial neural networks 402.

In terms of implementation, the artificial neural network 402 will be trained with every piece of data from the raw materials used to the process's flow, including all process parameters. The resulting hardware and the analytical outputs 444 will be compared with actual responses to the same external stimuli in in-vitro conditions for both animals and human beings. Based on the outcome of the comparisons on the statistically significant cohort of data, the artificial neural network 402 will be able to determine which parameters contribute to a closer emulation of real cells/organs/analytes 1.

Eventually, the computer-implemented artificial neural network 402 will be able to predict the parameters needed to emulate the cells/organs/analytes 1 actual conditions under question for in-vitro tests. Besides this, getting a better understanding of key parameters will help us build efficient models of various other organs, which are otherwise complex to build.

Accordingly, by comparing the data obtained from cells/organs/analytes 1 using the system according to the disclosure, including of the microfluidic device 100 accommodating one or more sample matrix' 10 with analytes 1, the hyperpolarizing (HP) preparation apparatus 200, and the NMR apparatus 300, for in-vitro and in-vivo conditions, implementing an artificial neural network 402 will help bridge the translational gap that is otherwise almost impossible to establish using current techniques.

The measurement chambers 110a of the multiple microfluidic elements 110 of the microfluidic device 100 allow for testing multiple responses of cells/organs/analytes 1 to the same external stimuli, that is, the same hyperpolarizing agent 6 and the same magnetic field gradients in, and applied set(s) of RF pulses in the target area 310. The objective is to understand the impact of the external stimuli on other cells/organs/analytes, besides the principal cell/organ/analyte 1 under investigation. Given the complexity of underlying biological processes, advanced methods like artificial intelligence are highly beneficial in understanding the correlation of responses among various cells/organs/analytes and eventually predicting the correlations and thereby responses.

In terms of implementation, the computer-implemented artificial neural network model 402 will be trained with primary and secondary organs' responses to the external stimuli. After training on statistically significant cohort of data, the computer-implemented artificial neural network model 402 will predict the responses of secondary organs to the same external stimuli (in particular, the hyperpolarizing agent 6 being used) that are being tested on the primary organ. These outcomes will help researchers understand the underlying biological mechanisms that are causing these effects and help narrow down the focus.

With this system 1000, a versatile platform is created, capable of real-time acquisition and analysis of metabolic data pertaining to a physiological condition in an analyte using HP and MR techniques in a non-invasive manner. With this platform, the development of more-advanced functional person-specific drug testing systems can be achieved.

The invention claimed is:

1. A system for determining a physiological condition in at least one analyte using hyperpolarized (HP) nuclear magnetic resonance, the system at least comprising:
   a hyperpolarizing (HP) preparation apparatus structure to hyperpolarize a substrate agent;
   a sample matrix for containing an analyte,
   a microfluidic device provided with at least one measuring chamber structured to accommodate the sample matrix containing the analyte, the microfluidic device being structured to infuse the at least one analyte accommodated in the sample matrix with the hyperpolarized substrate agent;
   a NMR apparatus at least comprising a housing defining a target area for accommodating at least the analyte with the hyperpolarized substrate agent, as well as at least one magnet unit and at least one magnetic gradient unit for applying—during use—one or more magnetic field gradients in the target area, and at least one radiofrequency (RF) pulse generation unit for applying one or more sets of RF pulses towards the target area, and a RF receiving unit for acquiring signals, and
   a computer processing unit for determining the physiological condition in the analyte by analysing the acquired signals.

2. A system according to claim 1, the hyperpolarizing (HP) preparation apparatus being one or more of a hyperpolarizer apparatus, a dynamic nuclear polarization (DNP) apparatus or a para-hydrogen induced polarization (PHIP) apparatus.

3. A system according to claim 1,
   the at least one measuring chamber being disposed in fluid communication with a matrix perfusion supply line for supplying a matrix perfusion medium to the measuring chamber, a hyperpolarized substrate agent supply line for supplying the hyperpolarized substrate agent to the measuring chamber and a chamber exit line, the hyperpolarized substrate supply line being located at a position above a position of the matrix perfusion supply line with respect to a bottom wall of the measuring chamber.

4. A system according to claim 3, the chamber exit line being positioned at a position lower than that of the hyperpolarized substrate supply line and at a position higher than that of the matrix perfusion supply line with respect to the bottom wall of the measuring chamber and the matrix perfusion supply line being positioned at the bottom wall of the measuring chamber.

5. A system according to claim 1,
   the microfluidic device comprising a temperature control unit for maintaining at least the analyte with the hyperpolarized substrate agent at body temperature when accommodated in the NMR apparatus.

6. A system according to claim 1,
   the computer processing unit being structured to analyse at least the acquired signals using one or more machine learning algorithms.

7. A system according to claim 6, the machine learning algorithm being a computer-implemented artificial neural network, and the computer processing unit furthermore comprising a training unit configured to train the computer-implemented artificial neural network with sequences of signals over time characterizing a training sequence of signals over time with known physiological conditions in an analyte contained in a hyperpolarized analyte agent; and to apply to the computer-implemented artificial neural network sequences of input signals characterizing at least a test sequence of signals over time with an unknown physiological condition in an analyte contained in a hyperpolarized analyte agent; and to analyse each applied test sequence of signals over time to generate a predicted physiological condition in an analyte contained in a hyperpolarized analyte agent for each test sequence of signals over time.

8. A method for determining a physiological condition in an analyte with a hyperpolarized substrate agent using the system according to claim 1, the method comprising the steps of:
   a) providing the analyte in the sample matrix;
   b) infusing the analyte with the hyperpolarized substrate agent;
   c) applying the one or more magnetic field gradients to the analyte with the hyperpolarized substrate agent using the at least one magnet unit and the at least one magnetic gradient unit of the NMR apparatus;
   d) applying the one or more sets of RF pulses towards the target area using the at least one radiofrequency (RF) pulse generation unit of the NMR apparatus;
   e) receiving from the RF receiving unit of the NMR apparatus a sequence of NMR signals over time in response to the one or more sets of RF pulses being applied;
   f) generating one or multiple time-frequency representations of the sequence of NMR signals by time-frequency transformation, and
   g) analysing the time-frequency representations using one or more machine learning algorithms for determining a physiological condition in the analyte.

9. A method of claim 8, the time-frequency transformation of step f) being selected from the group exemplified by but not limited to Fourier transform.

10. A method according to claim 9, after step b), but prior to step c), the method further comprising the step of b1) maintaining the analyte with the hyperpolarized substrate agent at body temperature.

11. A method of claim 8, the one or more machine learning algorithms being selected from the group exemplified by but not limited to an artificial neural network, a decision tree, a regression model, a k-nearest neighbour model, a partial least squares model, a support vector machine, or an ensemble of the models that are integrated to define an algorithm.

12. A method according to claim 8, the machine learning algorithm being a computer-implemented artificial neural network, and analysing step g) being preceded by the steps of:
   i) training the computer-implemented artificial neural network with sequences of NMR signals over time characterizing a training sequence of NMR signals over time with a known physiological condition in the analyte with the hyperpolarized substrate agent;
   ii) applying to the computer-implemented artificial neural network sequences of NMR input signals characterizing at least a test sequence of NMR signals over time with an unknown physiological condition in the analyte with the hyperpolarized substrate agent;
   iii) analysing each applied test sequence of NMR signals over time to generate a predicted physiological condition in the analyte with the hyperpolarized substrate agent for each test sequence of NMR signals over time.

13. A method according to claim 8, the receiving step b) being preceded by the step of:
   iv) hyperpolarizing the substrate agent in the hyperpolarizing (HP) preparation apparatus.

14. A method according to claim 8, the sample matrix being formed as a three-dimensional construct comprising open pores and the construct being a gel at least comprising sodium carboxymethyl cellulose.

15. A system according to claim 1, the sample matrix being formed as a three-dimensional construct comprising open pores and the construct being a gel at least comprising sodium carboxymethyl cellulose.

16. A system according to claim 15, the gel at least comprising one or more of 0.5-5% (wt.) sodium carboxymethyl cellulose, 1% (wt.) sodium carboxymethyl cellulose or the gel being suitable for cryopreservation.

* * * * *